United States Patent
Speirs, III et al.

(10) Patent No.: US 7,705,753 B2
(45) Date of Patent: Apr. 27, 2010

(54) METHODS, SYSTEMS AND COMPUTER-READABLE MEDIA FOR COMPRESSING DATA

(75) Inventors: William R. Speirs, III, West Laff, IN (US); Eric B. Cole, Leesburg, VA (US)

(73) Assignee: Sytex, Inc., Doylestown, PA (US)

( * ) Notice: Subject to any disclaimer, the term of this patent is extended or adjusted under 35 U.S.C. 154(b) by 967 days.

(21) Appl. No.: 11/163,552

(22) Filed: Oct. 22, 2005

(65) Prior Publication Data
US 2007/0139227 A1    Jun. 21, 2007

(51) Int. Cl.
*H03M 7/00* (2006.01)
(52) U.S. Cl. .................................................. 341/50
(58) Field of Classification Search .................. 341/50
See application file for complete search history.

(56) References Cited

U.S. PATENT DOCUMENTS

| | | | |
|---|---|---|---|
| 7,333,032 B1 * | 2/2008 | Ramachandran et al. | 341/50 |
| 2005/0146449 A1 * | 7/2005 | Adl-Tabatabai et al. | 341/51 |
| 2005/0193022 A1 * | 9/2005 | Rigerts et al. | 707/200 |

OTHER PUBLICATIONS

Brown, E. D.; Correlation between random data . . . , Jan. 2004, Google Groups-comp.compression URL-http://groups.google.com/group/comp.compression/browse_thread/thread/beb52b232587c32/d17db5bd175d7f94?hl=en&Ink=gst&q=Correlation+between+Random#d17db5bd175d7f94.*
McCullough P., Keyed XOR Compression, Apr. 2002, Google Groups-comp.compression, 4 pages, URL-http://groups.google.com/group/comp.compression/browse_thread/thread/33d171689732350e/44b135c957cc995a?hl=en&Ink=gst&q=Keyed+XOR+Compression#44b135c957cc995a.*
Macura, Data Compression with Cellular Automata, Internet publication—WolframScience.com NKS 2006, May 2006 URL http://www.wolframscience.com/conference/2006/presentations/macura.html.*
Fries, Hash zip, Internet publication URL: http://freedaemonconsulting.com/tech/hzip.php Jul. 2003.*

* cited by examiner

*Primary Examiner*—Howard Williams
(74) *Attorney, Agent, or Firm*—Buchanan Ingersoll & Rooney PC

(57) ABSTRACT

An approach is described for the compression of input data, and particularly one which is suited for providing a lossless method for compressing random input data. Both a compression algorithm is described, as well as a decompression algorithm for restoring the original uncompressed data. The decompression algorithm allows for its parameters to be adjusted to suit one's needs as they relate, for example, to the ratio of compression as a function of the decompression speed.

24 Claims, 9 Drawing Sheets

METHODS, SYSTEMS AND COMPUTER-READABLE MEDIA FOR COMPRESSING DATA

BACKGROUND

Data compression schemes are widely employed in many areas including the fields of communication systems and computer systems. Where communication systems are concerned, for example, one way to improve communication bandwidth is to transmit data in a compressed format. This permits the data to travel efficiently along data networks, such as local area networks (LANs), wide area networks (WANs), and the like without unduly constraining network resources. In this regard, innovative data compression and decompression schemes have evolved to improve upon communication bandwidth. In the field of computer systems, it is also desirable to compress data as this offers greater storage capabilities. Thus, for a storage device of a given capacity, more information can be stored in a compressed format compared to an uncompressed format.

The primary objective of data compression technologies is to minimize the amount of data transmitted or stored. Most compression schemes operate by detecting repeatable patterns or redundancies in the data and leveraging these patterns to compress the data. Generally speaking, the greater the redundancy the more efficient the compression scheme because redundant data may be represented with fewer bits, thereby reducing the total number of bits necessary to represent the information.

While there are a variety of compression schemes known in the art, they can all be considered to fall within one of two major categories: "lossless" or "lossy". A "lossless" data compression technique is employed when it is imperative that the restored data be identical to the original data—that is, when one can ill-afford to lose a single bit of data during the compression/decompression process. Situations in which a lossless technique is necessary include, for example, the compression of executable code, word processing files, tabulated numbers, etc. On the other hand, if absolute data integrity is not essential and some degradation from the original data can be tolerated, then a "lossy" compression technique may be preferred. Lossy compression methods, such as those promulgated by the Joint Photographic Experts Group (JPEG) and the Motion Pictures Experts Group (MPEG) are commonly used to manipulate digitized video and voice data, image files and the like, while lossless compression techniques are commonly used in computer systems to maximize the storage capacity of media such as hard disks. To this end, well known lossless compression methodologies which are both statistical and dictionary-based include Huffman coding (symbol-entropy-based), run-length encoding (RLE) or a modified form of RLE such as the Lempel-Ziv-Welch (LZW) algorithm (dictionary-based), or string table compression.

Designing compression and decompression algorithms that will excel in most situations is exceedingly difficult. Often, the best approach is to identify the type of data to be compressed and design an algorithm particularly suited for that data type, with the understanding that the algorithm will likely fail if applied to data of a different type. This concept can be appreciated, for example, when compression schemes such as PKZip and Bzip are applied against data which has been previously encrypted.

In the past, various approaches have been taken to compress both patterned (or redundant) data, as well as random data. For example, the lossless LZW method is described in U.S. Pat. No. 4,558,302 to Welch. Another example of a lossless compression approach is described in U.S. Pat. No. 5,594,435 to Remillard. U.S. Pat. No. 5,488,364 to Cole relates to a recursive data compression approach in which data is reconfigured in a manner that increases bit redundancy and thereafter compressed in an iterative or recursive manner until the desired compression ratio is obtained.

Not surprisingly, compression of random or encrypted data is inherently more difficult than patterned or redundant data since there are usually no patterns to be found. Randomized digital data of this nature, thus, cannot typically be compressed by normal compression algorithms. U.S. Pat. No. 5,486,826 also to Remillard employs entropy adjustment in connection with the compression of randomized digital data, irrespective of whether a prior compression technique has been applied to the information. Entropy is a term which relates to the randomness of the information. U.S. Pat. No. 5,533,051 to James discusses a variety of data compression approaches, one of which appears to be particularly directed to compacting a stream of randomly distributed data. According to this particular scheme, the data stream is divided into a plurality of blocks of randomly distributed data, at least one of which is selected and divided in the first and second portions. The occurrences of a pre-determined word within the first portion of the block is counted and the data within the second portion is compressed.

Unquestionably, a great deal of research has been conducted in attempts to compress random or encrypted data, as well as data which has previously been compressed. The above-mentioned patents provide some evidence of the amount of work performed in these areas. Aside from patented technology, information also periodically percolates in the field making lofty claims of compression capabilities, but it can sometimes be difficult to validate the veracity of such claims, or even the existence of programs which reportedly achieve them.

The pervasive nature of compression/decompression schemes illustrates the continuing need to provide improved approaches for effectively compressing and decompressing data. While various compression (and decompression) algorithms exist which are suitable for use with patterned data, a need particularly remains for a compression algorithm which will also reliably compress random data. Along these same lines, it is desirable to have both a compression and decompression scheme for use with random data, and particularly one which is flexible in nature to allow a user to selectively tailor various parameters to suit his/her particular needs.

The foregoing examples of the related art and its/their related limitations are intended to be illustrative and not exclusive. Other limitations may become apparent to those practiced in the art upon a reading of the specification and a study of the drawings.

BRIEF SUMMARY

The following embodiments and aspects thereof are described and illustrated in conjunction with methods, systems and devices which are meant to be exemplary and illustrative, not limiting in scope. In various embodiments, one or more of the above-described problems have been reduced or eliminated, while other embodiments are directed to other improvements. The various embodiments relate to the compression of input data, preferably random input data represented as a plurality of bits. Aspects of these embodiments are particularly suited for random input data which may be received either as a contiguous stream of bits which might, for example, be traversing a network segment, or as a static data file.

Illustrative is a data compression method which receives the binary input data and converts it into a group of sequential data blocks, preferably of equal size. The group includes an initial data block, at least one intermediary data block and a terminal data block. A data mask chain is derived from the group of data blocks. The data mask chain includes an ordered sequence of data masks for transitioning consecutively from the initial data block to the terminal data block. In the exemplary embodiments each transition is made according to a binary mathematical operation. Each binary mathematical operation, *, has the property such that, for all a and b, a*b=c and c*b=a. Preferably, this is accomplished by a plurality of Boolean logic operations, and more preferably by a plurality of exclusive OR (XOR) operations in which the sizes of a, b, and c are the same. A unique identifier is obtained for the data mask chain, and the data mask chain is converted into a truncated data mask chain. The initial data block, each truncated data mask and the terminal data block define a compressed data chain which, along with the identifier, are stored as a compilation of compressed output data derived from the binary input data.

In preferred embodiments, random input data is divided into an ordered sequence of input data blocks and the Boolean logic operation is performed with respect to each sequential pair of them to identify a data mask for the pair. The data mask, itself, is the resultant of the Boolean logic operation. Each data mask is converted into an associated truncated data mask according to a conversion scheme. Advantageously, a lookup table is provided and organized as a plurality of numbers each having an associated listing of data entries. Each data entry is correlated to a single number within the lookup table. Conveniently, each data mask may be matched with one of the data entries such that the number associated with the matched data entry becomes the truncated data mask.

The compressed output data may be stored as a compressed output file which includes a compressed data chain (comprising the initial data block, each truncated mask and the terminal data block) and the unique identifier. For smaller sized input data the identifier may be derived from a bitwise parity checking operation on the data mask chain. More preferably, though, the identifier is the resulting hash value obtained when the data mask chain is applied to a computationally collision resistant hash function.

Another embodiment of a data compression method receives an original file organized as a contiguous stream of random digitized data and divides the stream into one or more file segments, each of a common size. Each file segment is then compressed, such as described above, to produce compressed output data for each segment. An output compression file is then generated as an ordered compilation of each compressed chain and its associated hash value, and a composite hash value is computed for the output compression file.

Also described are systems for compressing input data, in which the systems comprise a storage device and a processing unit programmed in accordance with the described methods. Computer-readable media having executable instructions for accomplishing such methods are contemplated, as well.

These and other objects of the present invention will become more readily appreciated and understood from a consideration of the following detailed description of the exemplary embodiments of the present invention when taken together with the accompanying drawings, in which:

In addition to the exemplary aspects and embodiments discussed above, further aspects and embodiments will become apparent by study of the following descriptions and by reference to the drawings, in which:

BRIEF DESCRIPTION OF THE DRAWINGS

Exemplary embodiments are illustrated in the referenced figures of the drawings. It is intended that the embodiments and figures disclosed herein be considered illustrative rather than limiting. In the figures.

DETAILED DESCRIPTION

Figure 1:
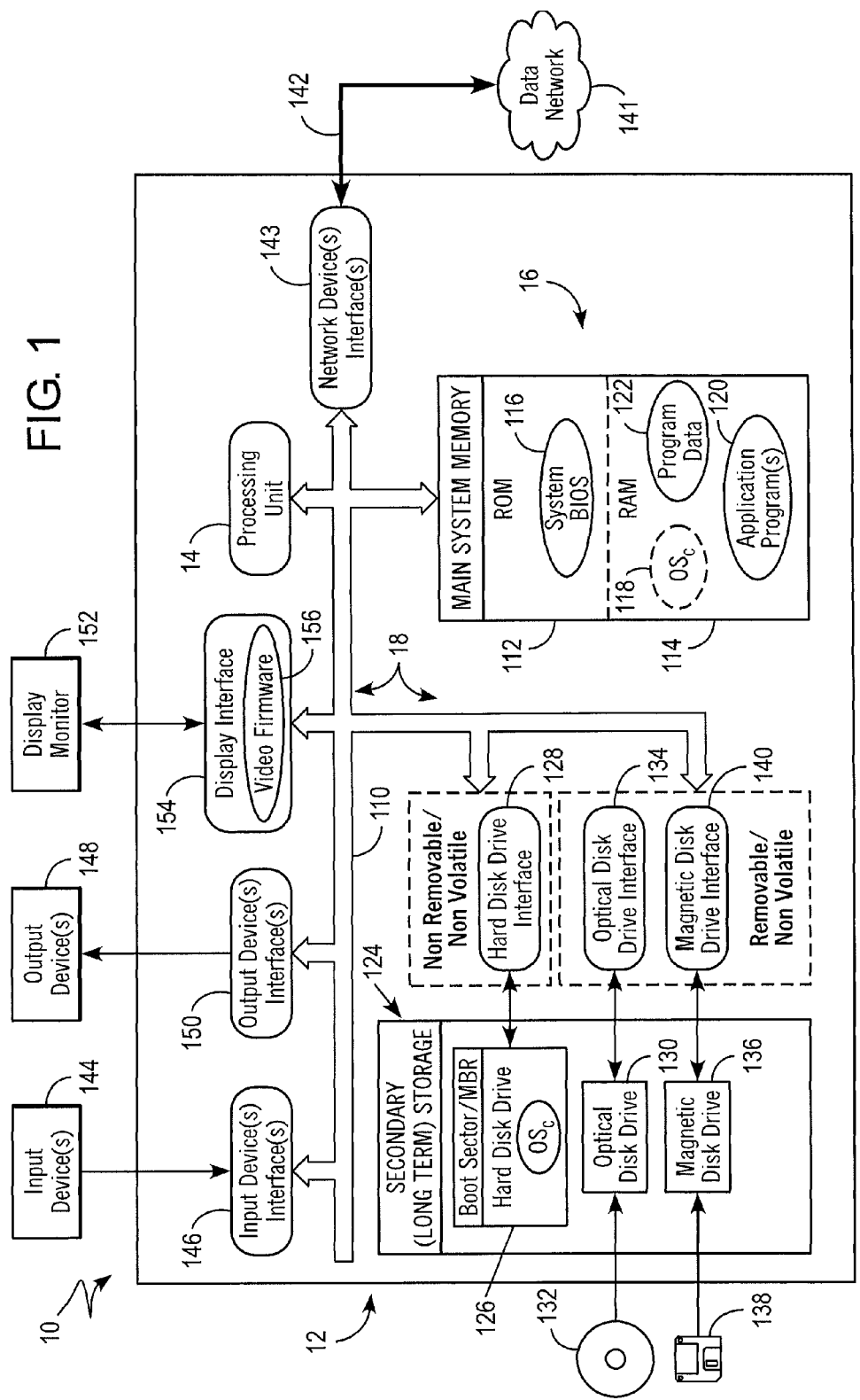
FIG. 1 illustrates a diagram of a representative general purpose computing environment that may be configured to implement aspects of the one or more described embodiments.

An approach is described for the compression of input data, and particularly one which is suited for providing a lossless method for compressing random input data. Both a compression algorithm is described, as well as a decompression algorithm for restoring the original uncompressed data. The decompression algorithm allows for its parameters to be adjusted to suit one's needs as they relate, for example, to the ratio of compression as a function of the decompression speed. For purposes of the description, random input data is that which is characterized by a plurality of bits having few, if any, detectable patterns or redundancies. Such data at times may be referred to herein as random digitized data. Typically, such random digitized data is that which has been previously compressed or encrypted so that it does not exhibit the patterns and redundancies typically found in non-random data. The ordinarily skilled artisan should appreciate, though, that while the embodiments are described with particular reference to random input data, both the compression and decompression algorithms could also be applied to non-random data, although there are known compression/decompression schemes which are perhaps better suited for such applications.

In the following detailed description, reference is made to the accompanying drawings which form a part hereof, and in which is shown by way of illustrations certain exemplary embodiments. The leading digit(s) of the reference numbers in the figures usually correlate to the figure number; one notable exception is that identical components which appear in multiple figures are identified by the same reference numbers. The embodiments illustrated by the figures are described in sufficient detail to enable those skilled in the art to practice the invention, and it is to be understood that other embodiments may be utilized and changes may be made without departing from the spirit and scope of the present invention. The following detailed description is, therefore, not to be taken in a limiting sense, and the scope of the present invention is defined by the appended claims.

Various terms are used throughout the description and the claims which should have conventional meanings to those with a pertinent understanding of data compression and decompression technologies. The ordinarily skilled artisan should appreciate that such terminology is employed in a descriptive sense and not a limiting sense. Where a confined meaning of a term is intended, it will be explicitly set forth or otherwise apparent from the disclosure.

Introduction

One of the described aspects of the invention relates to the compression of input data, and particularly a lossless method for compressing random input data. In this regard, random input data is that which is characterized by a plurality of bits which have few, if any, detectable patterns or redundancies. Such data is at times referred to as randomized digital data. Typically, such randomized digital data is that which has been previously compressed or encrypted so that it does not exhibit the patterns and redundancies typically found in non-random data. Another described aspect relates to the restoration of the input data via decompression. Thus, a compression algorithm is described, as well as a decompression algorithm for restoring the original uncompressed data.

The ordinarily skilled artisan should appreciate that while the embodiments are described with particular reference to random input data, both the compression and decompression algorithms could potentially also be applied to patterned data, even though there are known compression/decompression schemes which are perhaps better suited for such applications.

Before describing the invention in detail, embodiments of a representative computing environment for use in implementing aspects of the invention will be described with reference to FIG. 1 Representative computing environment 10 may utilize a general purpose computer system 12 for executing applications in accordance with the described teachings. Computer system 12 may be adapted to execute in any of the well-known operating system environments, such as Windows, UNIX, MAC-OS, OS2, PC-DOS, DOS, etc. System 12 includes a processing unit 14 (e.g., a CPU) for executing instructions, a system memory 16 for storing programs and data currently in use by the system, and an input output (I/O) system, generally 18. These various components are interconnected by a system bus 110 which may be any of a variety of bus architectures. System memory 16 may include both non-volatile read only memory (ROM) 112 and volatile memory such as static or dynamic random access memory (RAM) 114. Programmable read only memories (PROMs), erasable programmable read only memories (EPROMs) or electrically erasable programmable read only memories (EEPROMs) may be provided. ROM portion 112 stores a basic input/output system (the system BIOS). RAM portion 114 stores an operating system (OS) 118, one or more application programs 120 (e.g., the compression and decompression algorithms described herein), as well as program data 122.

Various types of storage devices can be provided as more permanent data storage areas for the application programs and other data. These can be either read from or written to such as contemplated by secondary (long term) storage 124. Suitable devices may, for example, include a non-removable, non-volatile storage device in the form of a large-capacity hard disk drive 126 which is connected to the system bus 110 by a hard disk drive interface 128 such as ATA (IDE, EIDE), SCSI, FireWire/IEEE 1_94, USB, or Fibre Channel. Hard disk drive 126 generally includes at least one bootable disk which stores the OS that is loaded into RAM 114 during a booting sequence, although the OS can alternatively be stored on removable media.

An optical disk drive 130 for use with are movable optical disk 132 such as a CD-ROM, DVD-ROM or other optical media, may also be provided and interfaced to system bus 110 by an associated optical disk drive interface 134. Computer system 12 may also have one or more magnetic disk drives 1366 for receiving removable storage, such as a floppy disk or other magnetic media 138, which itself is connected to system bus 110 via magnetic disk drive interface 140. Remote storage over a network is also contemplated.

One or more of the memory or storage regions mentioned above may comprise suitable media for storing programming code, data structures, computer-readable instructions or other data types for the computer system 12. Such information is then utilized by processor 14 so that the computer system 12 can be configured to embody the capabilities described herein.

Software embodying the present invention may be distributed in a variety of known manners, such as on computer-readable media, containing the executable instructions for performing the methodologies discussed herein. Alternatively, the software may be distributed over an appropriate communications interface so that it can be installed on the user's computer system. Furthermore, alternate embodiments which implement the invention in hardware, firmware or a combination of both hardware and firmware, as well as distributing the modules and/or the data in a different fashion will be apparent to those skilled in the art. It should, thus, be understood that the description is intended to be illustrative and not restrictive, and that many other embodiments will be apparent to those of skill in the art upon reviewing the description.

System 12 may be adapted to communicate with a data distribution network 141 (e.g., LAN, WAN, the Internet, etc.) via communication link(s) 142 so that, for instance, it can communicate with remote servers, clients, etc. Establishing network communications is aided by one or more network device interface(s) 143, such as a network interface card (NIC), a modem or the like suitably connected to the system bus 110. These can serve as a common interface for various other devices within a LAN and/or as an interface to allow networked computers to connect to external networks. System 12 preferably also operates with various input and output devices as part of I/O system 18. For example, user commands or other input data may be provided by any of a variety of known types of input devices 144 (e.g. keyboard, pointing device, game controller, power pad, digital camera, image scanner, modem, network card, touch screen, microphone) having associated input interface(s), generally 146. One or more output devices 148 (e.g. monitor or other suitable display device, printer, fax, recording device, plotter) with associated interfaces, generally 150, may also be provided. For instance, a display monitor 152 may be connected to the system bus 110 by a suitable display adapter 154 (i.e., video card) having associated video firmware 156.

Although certain aspects for a user's computer system may be preferred in the illustrative embodiments, the present invention should not be unduly limited as to the type of computers on which it can be implemented, and it should be readily understood that the present invention indeed contemplates use in conjunction with any appropriate information processing device (IPD) having the capability of being configured in a manner for accommodating the invention. Moreover, it should be recognized that the invention could be adapted for use on computers other than general purpose computers (e.g. embedded computers), as well as general purpose computers without conventional operating systems.

Figure 2:
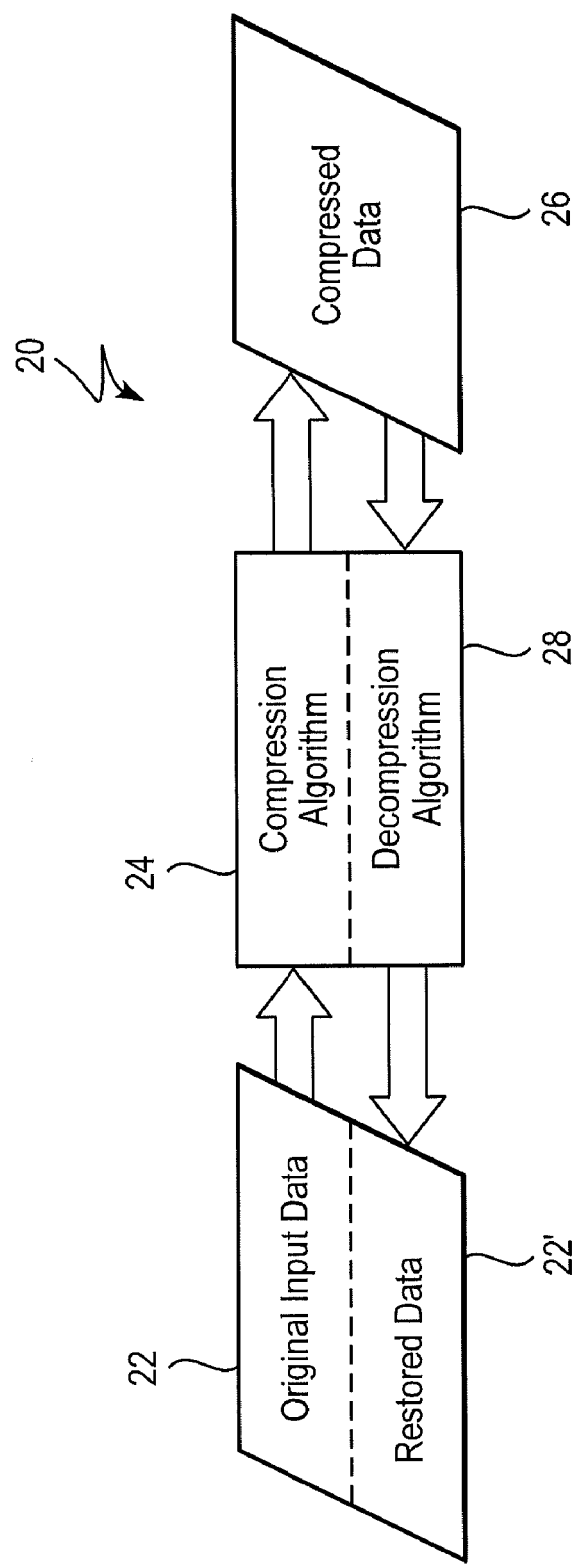
FIG. 2 is a block diagram depicting the described data compression and decompression techniques as they are applied to compress and then restore input data.

By way of introduction, FIG. 2 diagrammatically illustrates the compression/decompression technique 20. Original input data 22 is fed into a data compression algorithm 24 to produce compressed data 26. Original input data 22 may assume a variety of characteristics. That is, it may either be random or non-random data, although the algorithms described herein are more suitably tailored for use with random input data. Furthermore, original input data 22 may be static in the sense that it is stored as one or more files, or it may be streaming data such as that traversing a network segment which can be captured using a suitable device such as a network sniffer.

Where random data is used as the input the term "random" is intended to be construed in the broadest possible sense to encompass data derived from truly random sources in the natural environment, such as physical phenomena at the quantum level, or data derived from pseudo-random sources. A set of data is consider pseudo-random if it satisfies statistical tests for randomness, such as a frequency test, an autocorrelation, a serial test, a runs test, etc. Tests of this nature are described, for example, in the publication *Handbook of Applied Cryptography*, by Menezes, van Oorschot, and Vanstone, CRC Press, 1996. Moreover, pseudo-random data can be derived from a variety of sources such as compressed files, encrypted files, digitized video or voice data, image files and the like, without limitation. Data compression algorithm 24 is described in greater detail below with reference to FIGS. 1-5. Once the input data has been compressed, the process can be reversed so that the compressed data 26 is passed to a data decompression algorithm 28 to produce restored input data 22'. The decompression algorithm is described with reference to FIGS. 6-10. Assuming data decompression occurs without loss, then the restored input data 22' is identical to the original input data 22.

The ordinarily skilled artisan will appreciate that the data compression and decompression stages can take place at the same location, such as on a common computer system described above with reference to FIG. 1. Alternatively, these stages can be conducted on different systems. To illustrate, the data compression component may occur on a local computer system to compress localized random data which is then transmitted via a suitable data transmission network as compressed data to a remote computer system where it is thereafter decompressed to restore the data to its original form. Such a scenario might occur, for example, in connection with an e-mail transmission, an instant messaging (IM) transmission, the File Transfer Protocol, or the Hyper Text Transfer Protocol, to name a few.

The compression and decompression algorithms that are described compliment one another. The compression algorithm is first used to compress a file of random data and takes an amount of time to compress which is linearly related to the size of the input file. The decompression algorithm is then applied to the compressed output file to restore it to its original state. This algorithm is slower and its running time is exponentially related to the size of the compressed data.

1. Data Compression Stage

Figure 3:
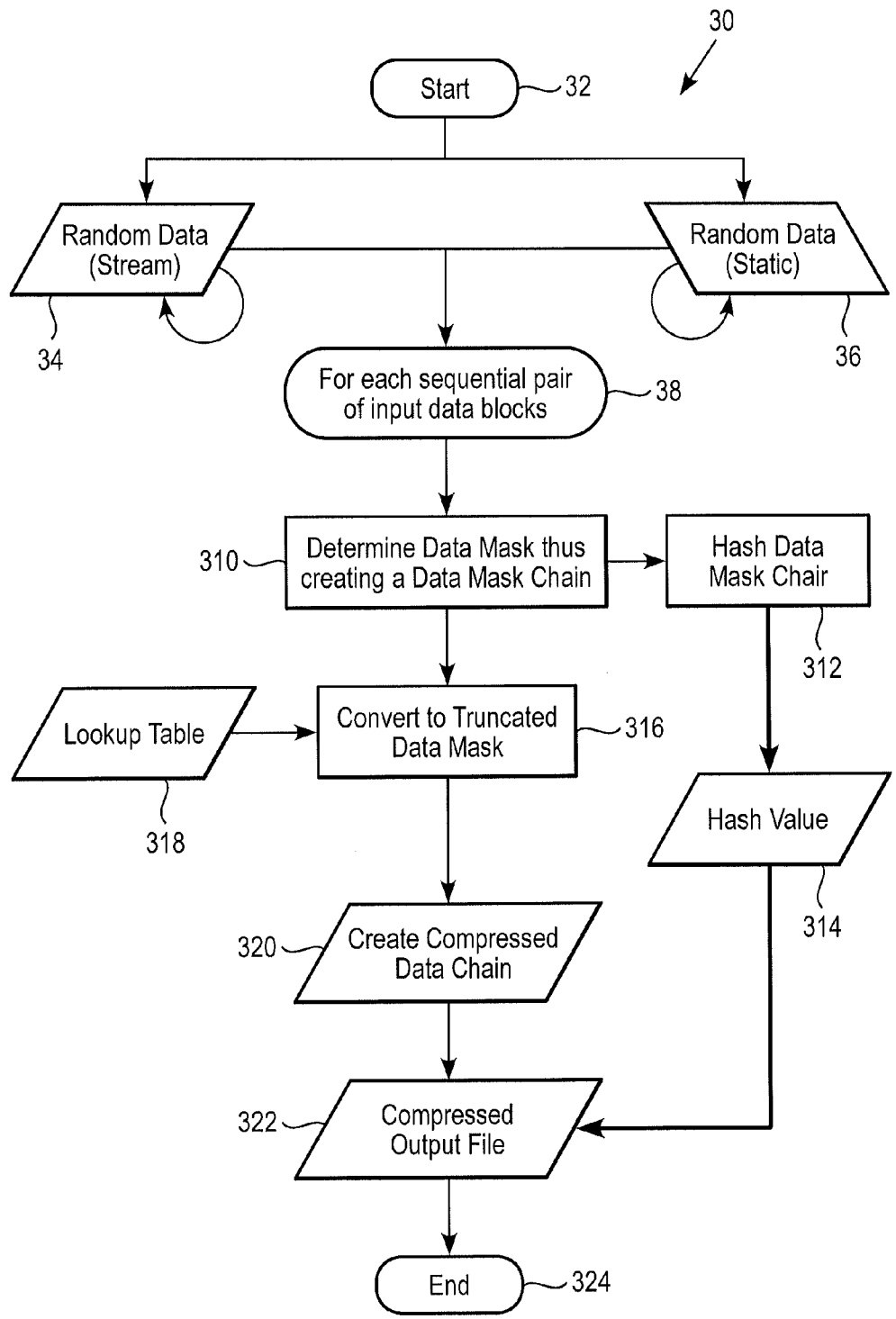
FIG. 3 is a high level flow diagram for the compression algorithm.

Initial reference is made to FIG. 3 which illustrates a high level flow diagram 30 for the compression algorithm. Following start 32 original input data is received as either a random data stream 34 or static random data 36, as mentioned above. The random input data is divided into a plurality of data blocks, preferably of equal size. For each sequential pair of input data blocks at 38 a data mask is determined 310 for the respective pair. Doing so defines a data chain which includes the initial data block, each data mask and the terminal data block. This data mask chain is then applied as an input to a computationally collision resistant hash function at 312 to generate a hash value at 314. Each data mask is converted to a truncated data mask at 316. This is accomplished by accessing a lookup table at 318. This defines a compressed data chain at 320 which comprises an initial data block which was read at either 34 or 36, each truncated data mask from 316 and a terminal data block which was read at either 34 or 36. The compressed data chain and its associated hash value 314 (derived from the data mask chain) are then stored as compressed output data 322, and flow 30 ends at 324.

Figure 4:
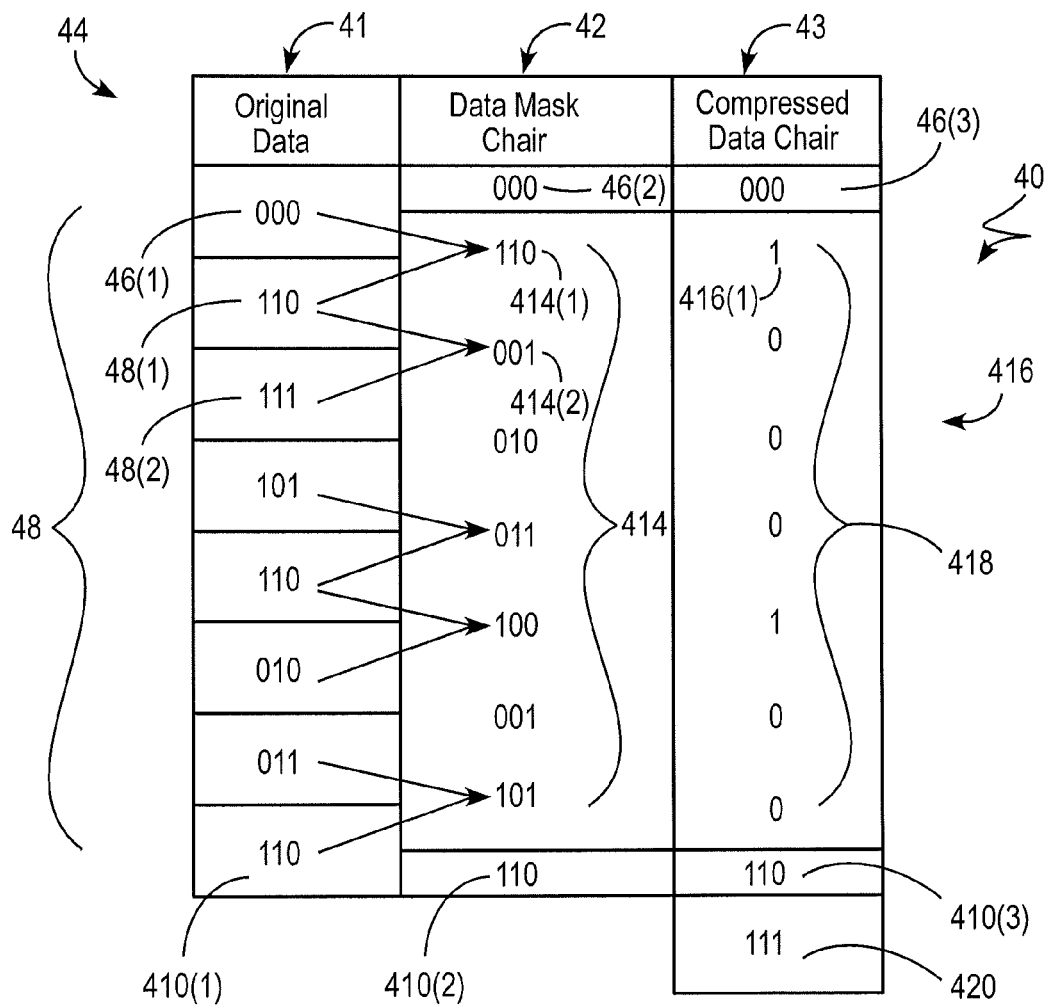
FIG. 4 is a table for illustrating the derivation of a compressed data chain from original input data.
Figure 5:
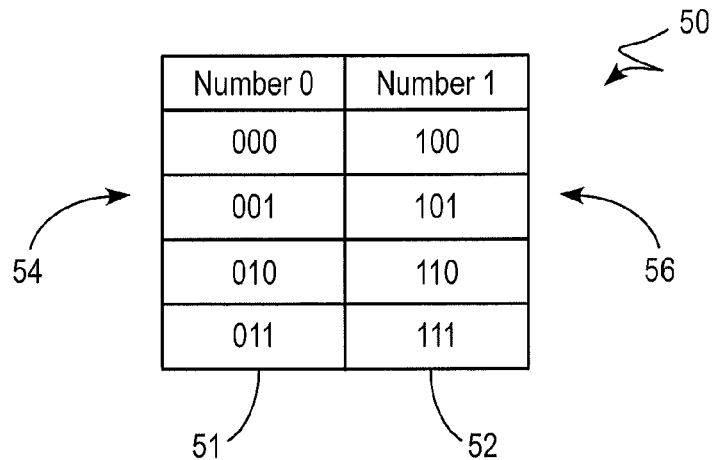
FIG. 5 is a representative compression lookup table.

Having described the general flow for the compression algorithm, reference is made to FIGS. 4 and 5 to illustrate application of the algorithm in a simple example with random data as the input. The random input data is represented in a tabulated format in the table 40 of FIG. 4 as the leftmost column 41. It should be appreciated that the original random input data 41 in this example could relate to an entire file or a segment of a larger file. Also, as mentioned above, data 41 could also represent a portion of a contiguous data stream. For purposes of this illustration, it is assumed that random input data 41 corresponds to the entirety of a single file to be compressed. The original input data has been divided into an ordered sequence of input data blocks 44, namely, an initial data block 46(1), a plurality of intermediate data blocks 48 and a terminal data block 410(1). It can be seen in this example that each data block is of equal size, namely, 3 bits and that the input file 34 is 3 bytes long.

Represented in the middle column 42 of FIG. 3 is a data mask chain 414 that is derived by performing a Boolean logic operation on the input data blocks 44. Data mask chain 414 includes the initial data block 46(2), a plurality of data mask blocks 414 and the terminal data block 410(2). Accordingly, the initial and terminal blocks within data mask chain 414 are carried over from the original file (or file segment, as the case may be). Thus, the term data mask chain should not be construed to require that each link in the chain actually form a data mask. Instead, in the exemplary embodiment of the invention, it is the intermediary data mask links 414 which are derived from Boolean logic operations. Thus, the term "data mask chain" is used for explanatory purposes and not by way of limitation.

In the exemplary embodiments, the Boolean logic operation from which each respective data mask is derived is an exclusive OR (XOR) operation. More particularly, the XOR operation is performed with respect to each sequential pair of input data blocks 44 within the file's ordered sequence as tabulated in FIG. 4. To illustrate, first data mask 414(1) is derived as a resultant of an XOR operation using initial input data block 46(2) and initial intermediary input data blocks 48(1) as the inputs. Similarly, intermediary data mask 414(2) is the resultant obtained using intermediary input data blocks 48(1) and 48(2) as the inputs, and so one. For ease of understanding, arrows are drawn in FIG. 4 to illustrate the inputs from which each data mask is derived so that it may be seen that the data mask chain 412 includes an ordered sequence of data masks for transitioning consecutively from initial data block 46(2) to terminal data block 310 according to the Boolean logic operations.

The rightmost column 43 in the table of FIG. 4 shows the compressed output data chain 416 which is then derived from data mask chain 414. Compressed data chain 416 includes initial data block 46(3), terminal data block 410(3), and a plurality of intermediary truncated data masks 418, each of which is derived from a corresponding one of the data masks 414. The derivation of the truncated data masks can be appreciated with reference to both FIGS. 4 and 5. In FIG. 4 a compression lookup table 50 is provided having a pair of columns 51 and 52, each corresponding to a number, namely Numbers "0" and "1" respectively. Associated with each of the numbers in the lookup table is a listing of data entries 54 and 56 respectively. Here, each listing includes a plurality of data entries associated with each of the numbers. More particularly, it may be appreciated that the data entries associated with Number "0" are the binary representations of decimal numbers 0-3, while those associated with Number "1" are the binary representations for decimals numbers 4-7.

It may also be seen that there is preferably a correspondence between the number of bits in the file's input data blocks and those associated with each number in the lookup table. For any resultant data mask 414 which is derived, it will have a corresponding number within the lookup table. In fact, each data mask will only correspond to one of the numbers in the lookup table. Thus, each truncated data mask 418 is derived as the number from the lookup table 50 for which the associated data mask is a listed entry. Once this is done, preferably consecutively for each data mask, it may be seen that compressed data chain is reduced by 14 bits compared to data mask chain 414 as a result of the truncation. Compressed output 40, which may be stored in a compressed output file, can be regarded as including the compressed data chain 416 and an identifier 420 in FIG. 4. This identifier can be used as a check when the compressed output file is decompressed to ensure that the original input data is properly reproduced. In this simplified example, it is preferred that identifier 420 is derived from a bit-wise parity checking operation on the data mask chain 414. However, since FIGS. 4 and 5 only represent a simplified example for purposes of illustrating the compression algorithm, it is more preferred for larger files (or larger segments of larger files) to employ an identifier which is the resulting hash value obtained when the data mask chain is applied to a computationally collision resistant hash function. To this end such a hash function may be one which either in the past has been, currently is, or in the future may be considered computationally collision resistant. Representative examples include SHA-1, the SHA-2 family of algorithms, MD5, RIPREMD160, HAVAL, Tiger, Snefru, and Whirlpool.

Figure 6:
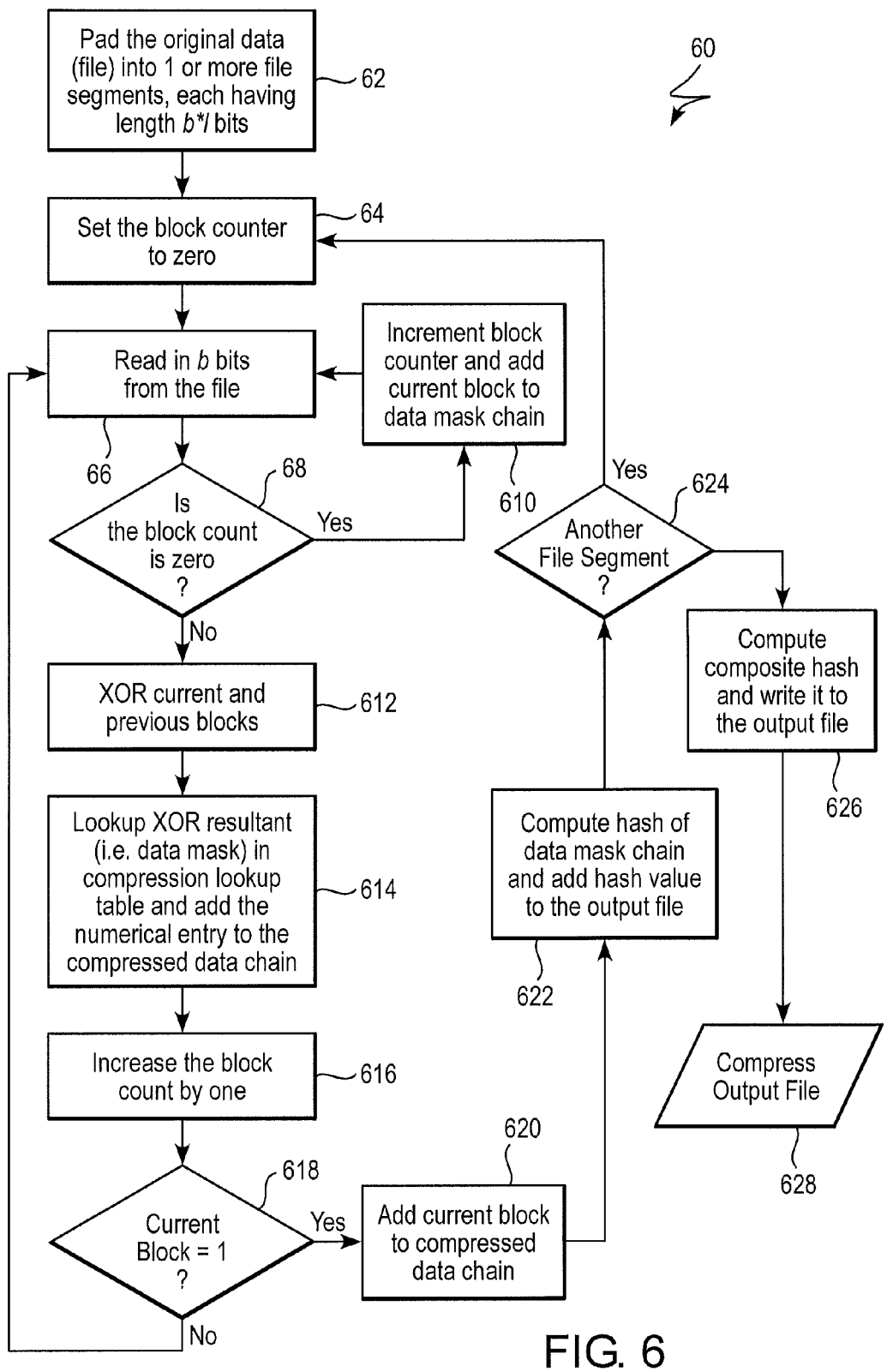
FIG. 6 is a more detailed flow diagram for the compression algorithm.

Having described the basic construct of the compression algorithm, reference is now made to FIG. 6 which more particularly illustrates the algorithm's flow. According to flow 60, the original input data (referred to as a file) is initially padded 62 to one or more file segments. Each file segment has a length of b*l, where b=the number of bits in a block, and l=the length in blocks of the data mask XOR chain (including the initial and terminal input blocks)

Figure 7:
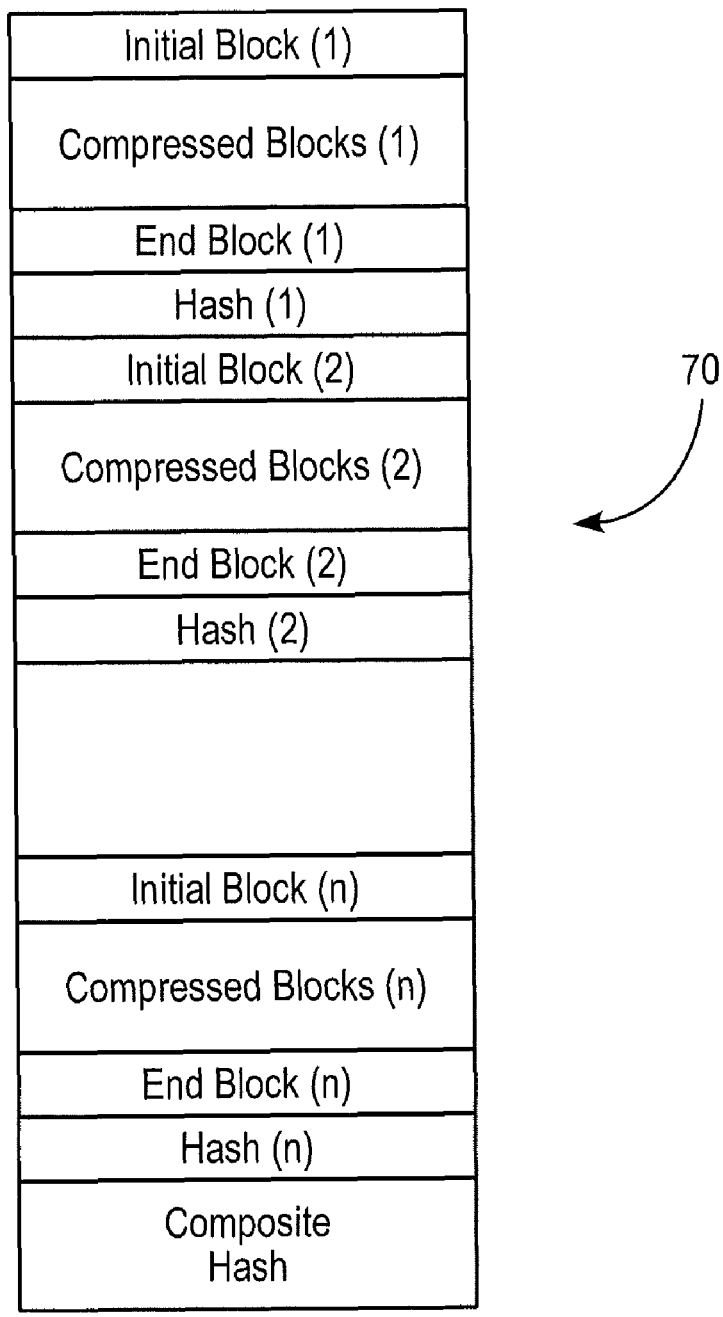
FIG. 7 is a blocked diagram of a logical construct of a compressed output file generated from dividing an input file into a plurality of file segments for compression.

At 64 a block counter is initially set to 0 and b bits from the file are read at 66. An inquiry is then made 68 to determine if the block count is 0. Of course, during the initial pass this would be the case and the block counter is thus incremented at 610 and the current block (i.e. the initial b bits) are added to the data mask chain. An additional b bits are again read 66 from the file. At this point 68 the block count is no longer 0 and the current block and the previous block are used as inputs to an XOR Boolean operation 612. The resultant data mask is looked up in the compression lookup table and its associated numerical entry is added to the compressed data chain at 614. The block counter is again incremented 616 and a determination is then made 618 as to whether the end of the file has been reached. This may be accomplished by ascertaining whether the block counter is equal to l. If not, then an additional b bits is read from the file and the above process is repeated until inquiry 618 is in the affirmative. At this point, the terminal data block has been reached and it is then added to the compressed data chain at 620. The hash for the data mask chain may be computed at 622 and the resultant hash value is added to the compressed output file. If there is another file segment to address at 624 the above process is repeated until all segments of the input data file have been addressed. Then, at 626 a composite hash value is computed and this is written to the compressed output file which would then have a logical construct 70 as illustrated in FIG. 7.

2. Data Decompression Stage

The decompression algorithm will now be discussed with reference to the remaining figures. The decompression algorithm works similarly to the compression algorithm, but in reverse. All of the information that is needed to reconstruct the original input data is included in the compressed output file, provided one has access to the compression lookup table. However, it is only known with a probability that is dependent upon the hash when a particular result of the decompression algorithm is the correct one and corresponds to the original input data.

Figure 8:
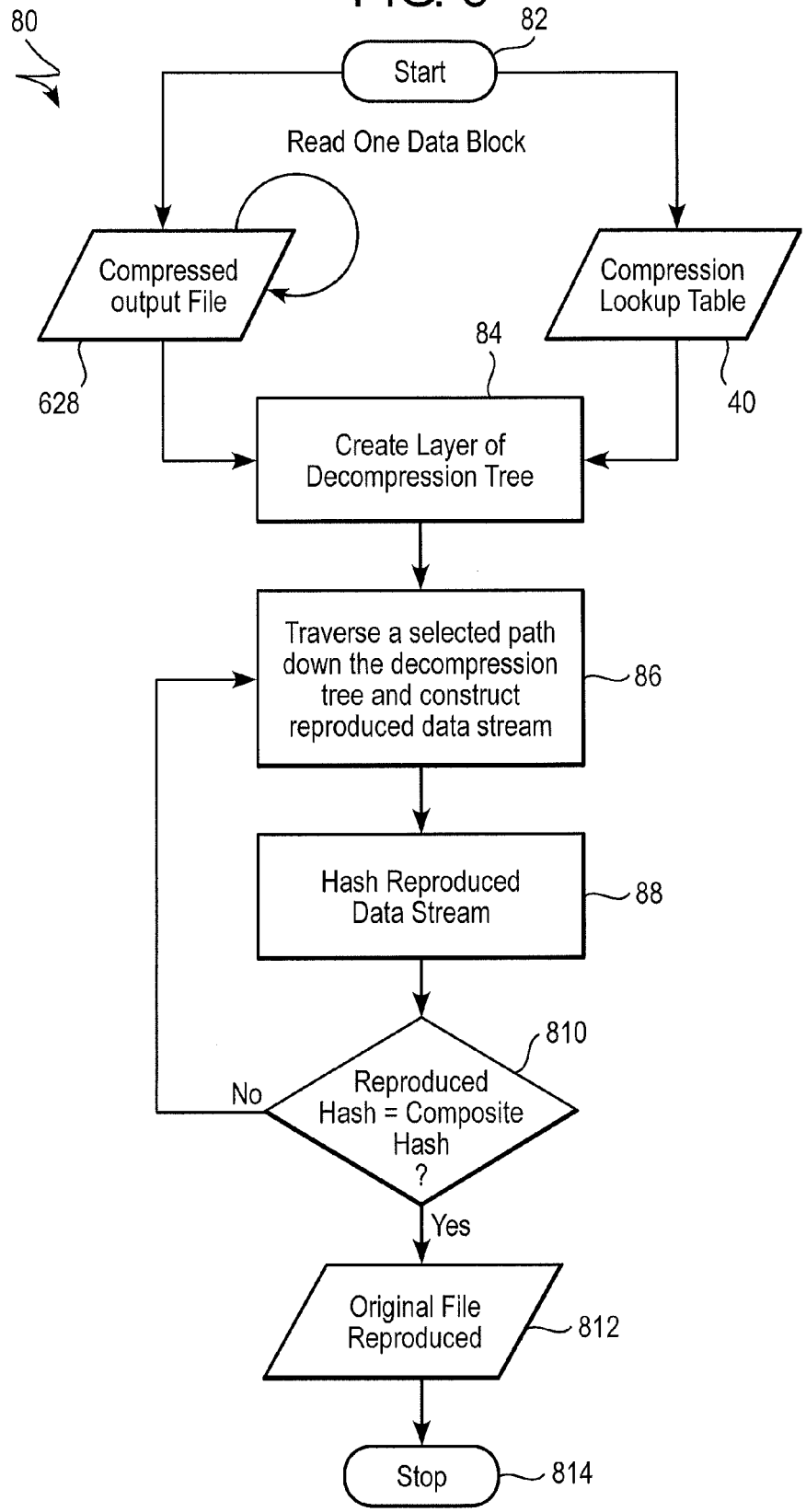
FIG. 8 is a high level flow diagram for the decompression algorithm.
Figure 9:
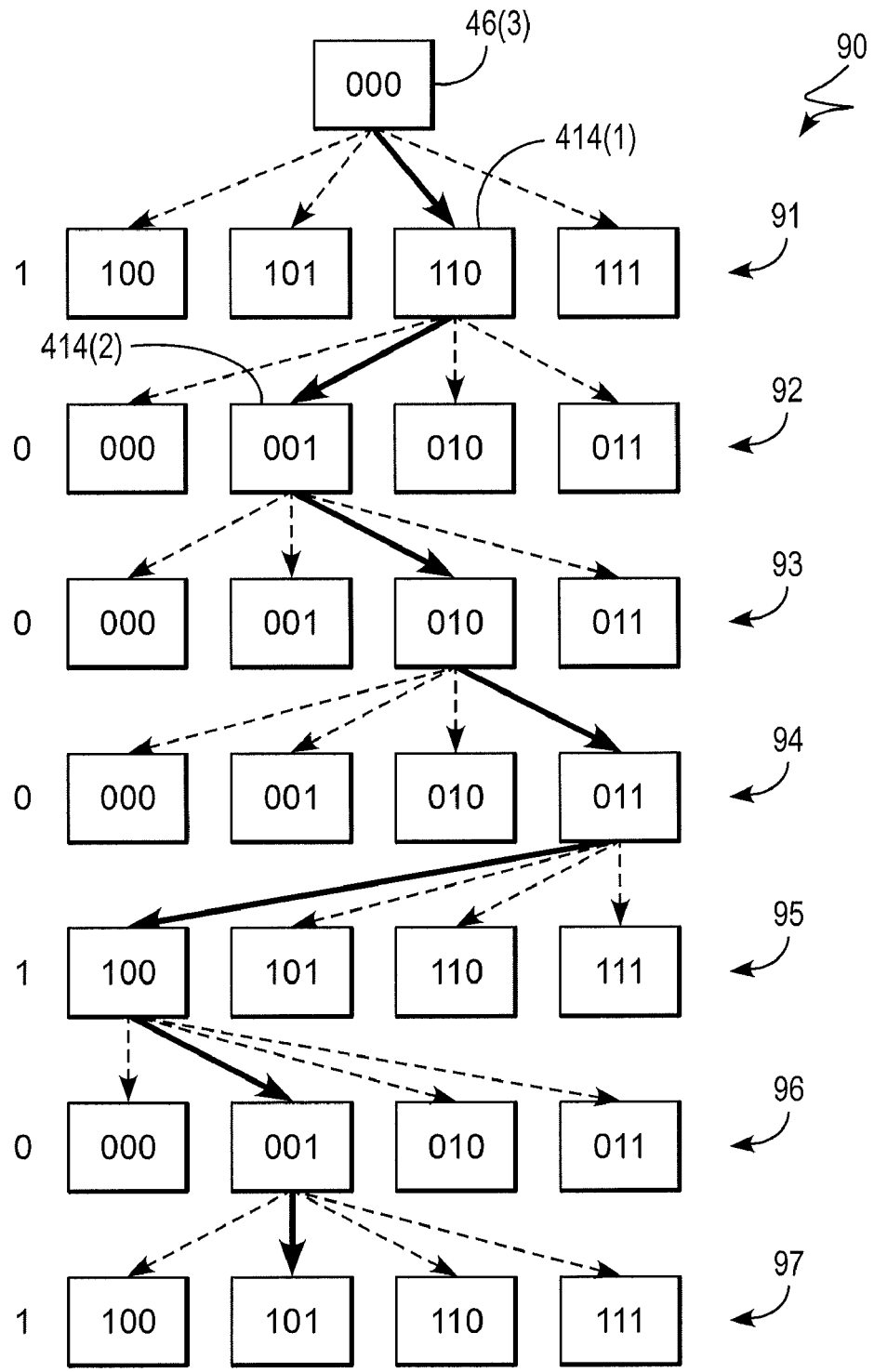
FIG. 9 diagrammatically illustrates a portion of a logical decompression tree generated by the decompression algorithm.

To appreciate the decompression stage, initial reference is made to FIGS. 8 and 9, which continue with the example used to explain the compression stage. Decompression flow 80 begins at 82 in FIG. 8 and, necessarily, requires access to the compressed output file 628 and the compression look up table 50. An initial layer of a decompression tree, such as layer 91 of decompression tree portion 90, is generated at 84. This is accomplished by starting with the initial input block in the compressed output file which, as described above, is the same as the initial input data block 46(3). From a programming standpoint, a logical tree is constructed of all possible decompressions of the compressed output file. However, since this would be much to involved to represent in figures, only a portion of the tree is shown in FIG. 9 which shows (via the solid arrows) the proper decompression path to regenerate the original input data.

Thus, with continued reference to FIG. 8 an initial pathway down the decompression tree is traversed at 86 to construct a reproduced data stream which is then hashed at 88. Sequentially, the various possible pathways through the layers of the decompression tree are traversed until at 810 the reproduced hash for a given path equals the composite hash generated by the compression algorithm. At this point 812, the original file is reproduced and decompression algorithm ends at 814. Of course, the artisan will realize that if only one original input data is not divided into more that one file segment, then there is only one hash for the file, which can still be regarded as a composite hash, so that the flow diagram of FIG. 8 contemplates such a situation.

Starting with the initial data block 46(3) in FIG. 9 it is known that the next bit in the compressed data chain (FIG. 4), and also the compressed output file for that matter, is the truncated data mask "1". The truncated data masks from the compressed data chain are reproduced in FIG. 9 adjacent to each layer 91-97 for ease of explanation. Each of the data entries within the listing corresponding to the Number "1" in FIG. 5 thus comprise layer 91 of the decompression tree. Initially, then, this dictates four possible pathways for the decompression algorithm to take in order to begin regenerating the original input data. The XOR Boolean operation can then now be performed with respect to each of the possibilities using the initial data block 46(3) as a common input. Thus, upon arriving at the initial intermediary data mask 414(1), and knowing the initial data block 46(3) from the original file, the first intermediary data block 48(1) can be derived through the XOR Boolean operation which now uses 46(3) and 414(1) as the inputs.

Since the initial intermediate data block 414(1) from the data mask chain is binary "110", decompression tree portion 90 shows an extrapolation from this block to generate a second layer 92. The next bit in the compressed data chain (FIG. 4) is the truncated data mask "0" such that the corresponding data entries for that number in the compression lookup table 50 are reproduced to comprise a portion of layer 92, it being understood that in actuality layer 92 would potentially have four times the number of nodes shown in FIG. 9 since the decompression algorithm would branch off from each of the remaining nodes in layer 91 other than just that corresponding to data mask 414(1).

Here again, when the decompression algorithm properly reproduces the original file (that is, when the reproduced hash equals the composite hash), it will have preceded to the second intermediary data mask 414(2) corresponding to the binary block "001". The artisan should appreciate that this process is repeated down the remaining layers 93-97 of decompression tree portion 90 until the entire data mask chain 414 (FIG. 4) is properly reproduced.

Accordingly, decompression is accomplished by starting with the initial data block 46(3), "000" in the above example, and constructing a tree of all possible decompressions to generate various test files each having bit stream patterns. The hash values of these stream patterns are then compared to the composite hash to ascertain whether the particular test file which is regenerated corresponds to the original input file. In a worst case scenario, each possible path in the tree from the root (the initial data block) to the end leaves (the various possible terminal data blocks, such as those represented at level 97) may be traversed in a depth first fashion until the proper data mask chain is reached. A proper data mask chain is one in which the masks are applied one after the other as the tree is traversed from root to leaves such that the final application of the data mask results in the terminal data block, 410(2) in FIG. 4.

The decompression algorithm continues through the entire compressed output file decompressing each block one at a time. When the entire file has been reconstructed a regenerated hash can be computed to ascertain if it matches the composite hash that was appended to the end of the compressed output file. Making sure that these hashes match will improve the probability that the original input data was properly reconstructed. Understandably, for a large number of paths from the root to the terminal leaves, the mask will not work, and the resulting terminal bits will not match the bit pattern of terminal block 410(2). Any such path can then be eliminated. On the other hand, branches will result in bit pattern corresponding to terminal block 410(2), so it is the job of the included composite hash to determine which of the paths is actually the correct one. Assuming a computationally collision free hash function is used, then the probability that a path will result in a proper data mask, and that the data mask chain will hash to a correct hash without it being the original data is very, very small.

Figure 10:
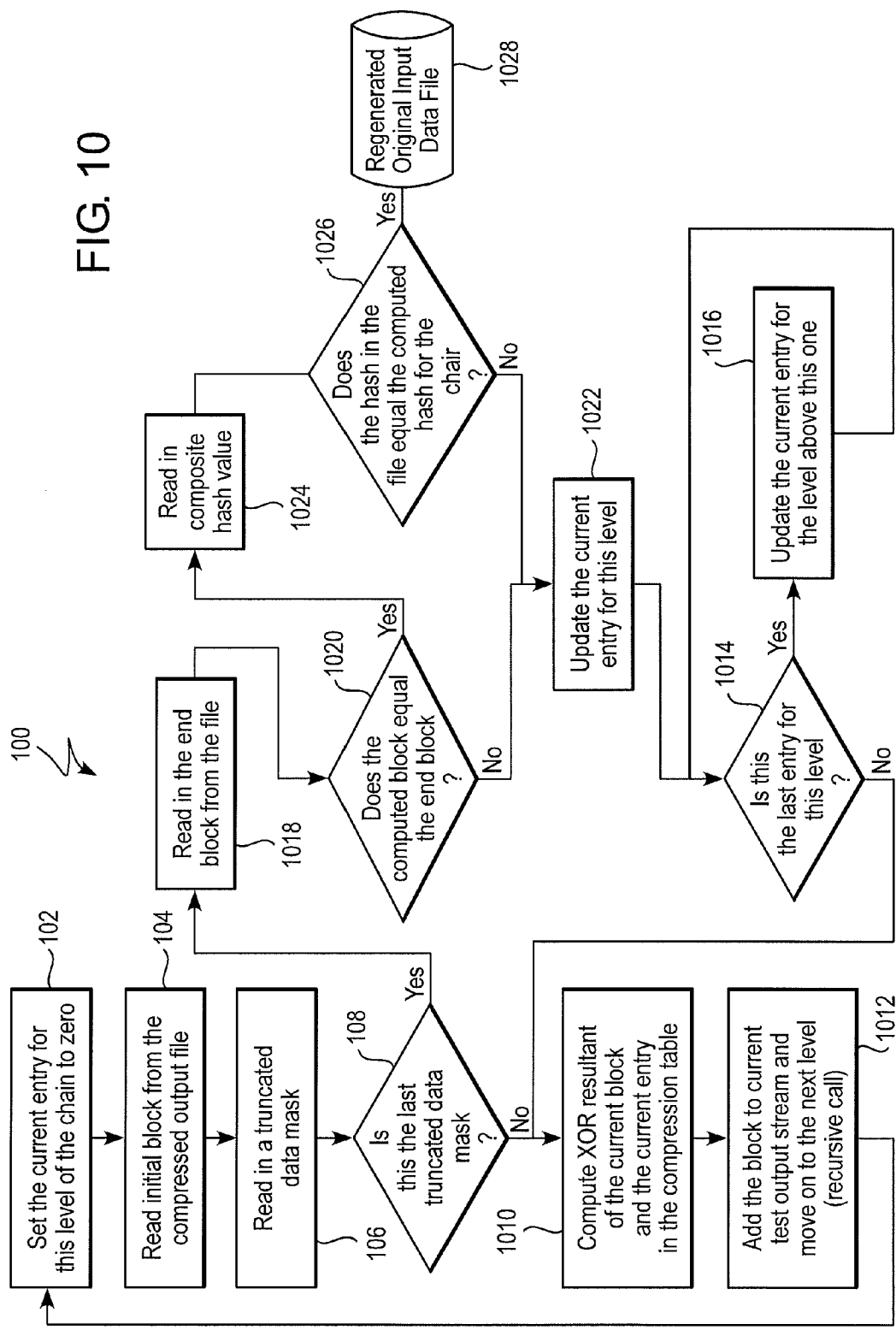
FIG. 10 is a more detailed flow diagram for the decompression algorithm.

With reference to FIG. 10, a more detailed flow 100 for the decompression algorithm is described. As one of ordinary skill in the field would appreciate, the decompression algorithm is preferably implemented with a recursive function which is difficult to represent using a flow diagram. Accordingly, the flow chart of FIG. 10 discusses levels which are analogous to the levels of the recursive call when the decompression algorithm is implemented. There is state information that is carried from one recursive call to the next. In this case, that state information is the corresponding entry in the compression lookup table which is being used to compute an output block.

At 102 the current entry for the level of the decompression chain is set to zero. The initial block from the compressed output file (i.e. the initial input data block 46(3) in the example) is read 104. At 106 a truncated block is read from the compressed output file which, in the initial cycle corresponds to truncated data mask 416(1) in FIG. 4. Assuming this is not the last truncated mask entry 108 then an XOR resultant value is obtained 1010 using the current block and the current entry in the compression lookup table which corresponds to the truncated data mask's associated number. Thus, in an initial pass, this would correspond to an XOR or Boolean operation of initial data block 46(3) (000) and the first entry (binary "100") associated with the Number 1 in compression table 50. This XOR resultant block is then added to the current test output stream at 1012, and flow proceeds to the next level as depicted in FIG. 9. The above is recursively done for all entries until the last truncated mask entry for the current level is reached at 1014, at which point the current entry for the level above this one is updated at 1016.

Once the final truncated data mask entry is reached, the terminal block is read from the compressed output file at 1018. In the simplified example which we have been discussing, this corresponds to block 410(3) (FIG. 4). An inquiry is made at 1020 as to whether the computed block from the XOR computation at 1010 equals the terminal block from the compressed output file. If not, then the current entry for the level is updated at 1022. Inquiry 1014 is processed and flow will either proceed to 1016 or 1010. If the computed block (i.e. the XOR resultant value) from 1010 equals the terminal data block from the compressed output file then composite hash value from the compressed output is read at 1024, and a determination is made at 1026 whether the composite hash is the same as the computed hash for the current chain. If so, then original input data file is properly reproduced at 1028, resulting in successful decompression.

3. Compression/Decompression Formulas

Having described the concepts of the compression and decompression algorithms, it can be appreciated that there are various parameters that can be changed that influence their behavior. At least three formulas dictate the behavior of the algorithms: the compression algorithm running time, the compression ratio, and the decompression running time. For all of these formulas, it is assumed that the running time of the hash function used is linear in the number of bits it is hashing, or:

$$O(n)$$

where n is the number of bits to be hashed. It is also assumed that the hash function used is computationally collision resistant. Various formulas associated with the compression and decompression algorithms the following variables are defined:

Let n=the number of bits in a file

Let b=the number of bits in a block

Let g=the number of blocks in a column in the compression table

Let m=the number of columns in the compression table

Let h=the number of bits in the size of the hash function

Let l=the length of an XOR chain, in blocks (including the initial and terminal blocks)

Let R=the compression ratio of a file

The running time for compression is linear as it relates to the number of bits in the file. Expressed mathematically, this results in the following:

$$O(n)$$

The running time is linear in the number of bits in the file because constant time work is preformed on each bit (or block of bits) in the file.

Due to the numerous possibilities for traversing the decompression tree, the decompression of a file is unfortunately exponential in the size of the compressed input data. The running time for decompression is:

$$O\left(g^{l-3} \times \frac{n}{bl}\right)$$

This formula is derived from the amount of work it would require to search an entire tree for the proper data mask chain, which is $g^{l-3}$ because the initial and terminal blocks do not need to be searched. Also, in calculating the number possible paths to searched in the tree, the formula is $d^{p-1}$, where d is the degree of the tree—that is, the number of branches per node (four in this example)—, and p is the height (or number of levels) of the tree.

The amount of compression of a file is dictated by the number of columns in the compression table, the number of bits in each block and the number of blocks in the data mask chain. The compression ratio of the file can be defined in bits as follows:

$$R = \left(1 - \frac{\text{Compressed Size}}{\text{Original Size}}\right) \times 100 \qquad (1)$$

$$\text{Compressed Size} = (\text{Size of } XOR \text{ Chain}) \times (\text{\# of Chains}) + h \qquad (2)$$

$$\text{Size of } XOR \text{ Chain (in bits)} = 2b + h + (l-2) \times \lceil \log_2(m) \rceil \qquad (3)$$

$$\text{\# of Chains} = \frac{n/b}{l} = \frac{n}{bl} \qquad (4)$$

With the exception perhaps of equations (3), the equations above are self-explanatory. As for equation (3), the 2b part of the formula is for the size in bits of the initial and terminal blocks found in a data mask chain chain. The h is for the size in bits of the hash that is associated with each chain. While technically this is not part of the chain, it makes for easier calculations. The portion:

$$(l-2) \times \lceil \log(m) \rceil$$

calculates the number of compressed blocks by the size of each compressed block. Putting all the pieces together yields the overall compression ratio for a file:

4. Examples $$R = \left(1 - \frac{(2b + h + ((l-2) \times \lceil \log_2(m) \rceil)) \times \frac{n}{bl} + h}{n}\right) \times 100 \qquad (5)$$

Some representative examples will be used to illustrate how the above formulas and variables interact.

Let $n = 160$

Let $b = 8$

Let $g = \frac{2^b}{m}$ $$= \frac{2^8}{2}$$

$$= 128$$

Let $m = 2$

Let $h = 8$

Let $l = 10$

Part of the compression table for this example would look as in Table I below. It should be appreciated that Table I is not the entire table since the complete table would have 256 entries with in it.

TABLE I

| Number 0 | Number 1 |
|---|---|
| 0000 0000 | 1000 0000 |
| 0000 0001 | 1000 0001 |
| 0000 0010 | 1000 0010 |
| 0000 0011 | 1000 0011 |
| 0000 0100 | 1000 0100 |
| 0000 0101 | 1000 0101 |
| 0000 0110 | 1000 0110 |
| 0000 0111 | 1000 0111 |
| ... | ... |
| 0111 1000 | 1111 1000 |
| 0111 1001 | 1111 1001 |
| 0111 1010 | 1111 1010 |
| 0111 1011 | 1111 1011 |
| 0111 1100 | 1111 1100 |
| 0111 1101 | 1111 1101 |
| 0111 1110 | 1111 1110 |
| 0111 1111 | 1111 1111 |

The compression running time is then:

$$O(n) = 160$$

The decompression running time is:

$$128^7 \times \frac{160}{80} = 1,125,899,906,842,624 = 2^{50}$$

The running time for the decompression is extremely long, but inside of computational feasibility for a suitably powered machine.

The compression ratio for this example is calculated as follows:

$$R = \left(1 - \frac{(2b + h + ((l-2) \times \lceil \log_2(m) \rceil)) \times \frac{n}{bl} + h}{n}\right) \times 100 \qquad (6)$$

$$R = \left(1 - \frac{(16 + 8 + (8 \times \lceil \log_2(2) \rceil)) \times \frac{160}{80} + 8}{160}\right) \times 100 \qquad (7)$$

$$R = \left(1 - \frac{32 \times 2 + 8}{160}\right) \times 100 \qquad (8)$$

$$R = \left(1 - \frac{72}{160}\right) \times 100 \qquad (9)$$

$$R = 55\% \qquad (10)$$

So, overall this algorithm will compress the original file by 55% but take on the order of $2^{50}$ computations to decompress the file.

Using the same numbers, but these time changing the size of the compression table from m=2 to m=4 results in:

$$g = \frac{2^b}{m} = 64$$

Such a compression might look, in part, as in Table II below. Again, the complete compression table would have 256 entries in it, as above.:

TABLE II

| Number 09 | Number 01 | Number 10 | Number 11 |
|---|---|---|---|
| 0000 0000 | 0100 0000 | 1000 0000 | 1100 0000 |
| 0000 0001 | 0100 0001 | 1000 0001 | 1100 0001 |
| 0000 0010 | 0100 0010 | 1000 0010 | 1100 0010 |
| 0000 0011 | 0100 0011 | 1000 0011 | 1100 0011 |
| 0000 0100 | 0100 0100 | 1000 0100 | 1100 0100 |
| 0000 0101 | 0100 0101 | 1000 0101 | 1100 0101 |
| 0000 0110 | 0100 0110 | 1000 0110 | 1100 0110 |
| 0000 0111 | 0100 0111 | 1000 0111 | 1100 0111 |
| ... | ... | ... | ... |
| 0011 1000 | 0111 1000 | 1011 1000 | 1111 1000 |
| 0011 1001 | 0111 1001 | 1011 1001 | 1111 1001 |
| 0011 1010 | 0111 1010 | 1011 1010 | 1111 1010 |
| 0011 1011 | 0111 1011 | 1011 1011 | 1111 1011 |
| 0011 1100 | 0111 1100 | 1011 1100 | 1111 1100 |
| 0011 1101 | 0111 1101 | 1011 1101 | 1111 1101 |
| 0011 1110 | 0111 1110 | 1011 1110 | 1111 1110 |
| 0011 1111 | 0111 1111 | 1011 1111 | 1111 1111 |

The running times and compression ratio for this scenario are:

Compression running time: $O(n)=160$

Decompression running time: $O\left(g^{l-3} \times \frac{n}{bl}\right) = 64^7 * 2 \approx 2^{43}$ Compression Ratio:

$$R = \left(1 - \frac{(2b+h+((l-2)\times[\log_2(m)]))\times \frac{n}{bl}+h}{n}\right)\times 100 \quad (11)$$

$$R = \left(1 - \frac{(16+8+(8\times[\log_2(4)]))\times \frac{160}{80}+8}{160}\right)\times 100 \quad (12)$$

$$R = \left(1 - \frac{40\times 2+8}{160}\right)\times 100 \quad (13)$$

$$R = \left(1 - \frac{88}{160}\right)\times 100 \quad (14)$$

$$R = 45\% \quad (15)$$

So using a table that has twice as many columns reduces the compression ratio of the algorithm by 10%. However, the running time goes from $2^{50}$ to $2^{43}$ which represents a tremendous reduction in the running time for decompression.

With an appreciation of the various equations which dictate the characteristics of the compression and decompression algorithms, the ordinarily skilled artisan will appreciate that graphs and/or tables that could be generated, for example, to determine optimal parameters the compression and decompression of data under different circumstances.

Accordingly, the present invention has been described with some degree of particularity directed to the exemplary embodiments of the present invention. While a number of exemplary aspects and embodiments have been discussed, those of skill in the art will recognize certain modifications, permutations, additions and sub-combinations thereof. It is therefore intended that the following appended claims and any claims hereafter introduced be interpreted to include all such modifications, permutations, additions and sub-combinations as are within their true spirit and scope.

What is claimed is:

1. A method of compressing random input data that is represented as a plurality of bits, comprising:
    a. dividing the random input data into an ordered sequence of input data blocks which includes an initial data block, a plurality of intermediate data blocks, and a terminal data block;
    b. with respect to each sequential pair of input data blocks within said ordered sequence:
        i. performing a binary mathematical operation on the input data blocks to generate a data mask for the sequential pair, said data mask being a resultant of said binary mathematical operation; and
        ii. converting said data mask into a truncated data mask according to a selected conversion scheme;
    c. computing an identifier for a data mask chain which comprises said initial data block, each said data mask and said terminal data block; and
    d. storing said identifier and a compressed data chain as compressed output data, wherein said compressed data chain comprising said initial data block, each truncated data mask and said terminal data block.

2. A method according to claim 1 wherein the random input data is a contiguous stream of bits.

3. A method according to claim 1 wherein said input data blocks are of equal bit size.

4. A method according to claim 3 wherein each input data block is one byte.

5. A method according to claim 1 wherein said binary mathematical operation is a Boolean logic operation.

6. A method according to claim 5 wherein said Boolean logic operation is an exclusive OR operation.

7. A method according to claim 1 wherein (b) is performed consecutively for each sequential pair of input data blocks within the ordered sequence.

8. A method according to claim 1 wherein a lookup table is organized as a plurality of numbers each having an associated listing of data entries, each data entry being correlated to only one of said numbers, and wherein said truncated data mask corresponds to a selected number with the lookup table having said data mask as one of its data entries.

9. A method according to claim 1 wherein said identifier is a resulting hash value obtained when the data mask chain is applied to a computationally collision resistant hash function.

10. A method according to claim 1 wherein said identifier is derived from a bitwise parity checking operation on the data mask chain.

11. A method of compressing random input data represented as a plurality of bits, comprising:
    a. means for dividing the random input data into an ordered sequence of input data blocks which includes an initial data block, a plurality of intermediate data blocks, and a terminal data block;

b. with respect to each sequential pair of input data blocks within said ordered sequence:
  i. means for identifying a data mask for transitioning from a first input data block to second input data block within the respective sequential pair; and
  ii. means for converting each associated data mask into a truncated data mask;
c. means for computing a unique identifier for a data mask chain which comprises said initial data block, each said data mask and said terminal data block; and
d. storage means for storing said unique identifier and a compressed data chain as compressed data output, wherein said compressed data chain comprises said initial data block, each truncated data mask and said terminal data block.

12. A data compression method, comprising:
a. receiving binary input data;
b. converting the binary input data into an group of sequential data blocks which includes an initial data block, at least one intermediary data block, and a terminal data block;
c. deriving a data mask chain from said group of data blocks, whereby said data mask chain includes an ordered sequence of data masks for transitioning consecutively from said initial data block to said terminal data block according to a plurality of like binary mathematical operations;
d. computing an identifier for said data mask chain; and
e. converting said data mask chain into a truncated data mask chain;
f. storing said initial data block, each truncated data mask, said terminal data block, and said identifier as a compilation of compressed output data derived from the binary input data.

13. A data compression method according to claim 12 whereby said binary input data is received as a contiguous data stream.

14. A data compression method according to claim 13 whereby said binary input data is random.

15. A data compression method according to claim 12 whereby said binary input data is random.

16. A data compression method according to claim 12 wherein said data blocks are of equal bit size.

17. A data compression method according to claim 12 including a plurality of intermediate data blocks.

18. A data compression method according to claim 12 whereby each of said binary mathematical operations is an exclusive OR operation.

19. A data compression method according to claim 18 each of said data masks is a resultant obtained when the exclusive OR operation is applied to a sequential pair of said data blocks.

20. A data compression method, comprising:
a. receiving an original file organized as a contiguous stream of random digitized data;
b. dividing said stream into n file segments each having a common size of b*l bits, where:
  n is an integer>=1;
  b is an integer>1; and
  l is an integer>2;
c. for each respective file segment:
  i. reading an initial b bits from the file segment;
  ii. storing said initial b bits as an initial data block of an associated compressed data chain for the file segment;
  iii. reading b additional bits from the file segment to define a current data block;
  iv. performing an exclusive OR Boolean logic operation on the current data block and the preceding b bits read from the file segment to generate an associated resultant data block;
  v. converting the resultant data block to a truncated data block;
  vi. appending the associated truncated data block to the associated compressed data chain;
  vii. repeating (iii) through (v) until b*l bits have been read from the file segment;
  viii. appending the file segment's terminal b bits to the associated compressed data chain;
  ix. computing a hash value for a resultant data block chain which includes said initial data block, each resultant data block and said terminal data block;
d. generating an output compression file as an ordered compilation of each compressed data chain and its associated hash value; and
e. computing a composite hash value for said output compression file.

21. A computer readable medium having executable instructions for performing a method, comprising:
a. receiving random input data represented as a plurality of bits;
b. dividing the random input data into an ordered sequence of input data blocks which includes an initial data block, a plurality of intermediate data blocks, and a terminal data block;
c. with respect to each sequential pair of input data blocks within said ordered sequence:
  i. performing a Boolean logic operation on the input data blocks to identify a data mask for the sequential pair, said data mask being a resultant of said Boolean logic operation;
  ii. converting said data mask into a truncated data mask according to a selected conversion scheme;
d. computing a unique identifier for a data mask chain which comprises said initial data block, each data mask and said terminal data block; and
e. storing said identifier and a compressed data chain as compressed output data, wherein said compressed data chain comprising said initial data block, each truncated data mask and said terminal data block.

22. A system for compressing random input data represented as a plurality of bits, comprising:
a. a storage device; and
b. a central processing unit (CPU) coupled to the memory storage device, wherein the CPU is programmed to:
  i. receive the random input data;
  ii. divide the random input data into an ordered sequence of input data blocks which includes an initial data block, a plurality of intermediate data blocks, and a terminal data block;
  iii. with respect to each sequential pair of input data blocks within said ordered sequence:
    perform a binary mathematical operation on the input data blocks to identify a data mask for the sequential pair, said data mask being a resultant of said binary mathematical operation; and
    convert said data mask into a truncated data mask according to a selected conversion scheme;
  iv. compute an identifier for a data mask chain which comprises said initial data block, each data mask and said terminal data block; and
  v. store said identifier and a compressed data chain as compressed output data, wherein said compressed data chain comprising said initial data block, each truncated data mask and said terminal data block.

23. A system for compressing random input data represented as a plurality of bits, comprising:
   a. storage means; and
   b. processing means coupled to said storage means, said processing means programmed to:
      i. receive the random input data;
      ii. divide the random input data into an ordered sequence of input data blocks which includes an initial data block, a plurality of intermediate data blocks, and a terminal data block;
      iii. with respect to each sequential pair of input data blocks within said ordered sequence:
         perform a binary mathematical operation on the input data blocks to identify a data mask for the sequential pair, said data mask being a resultant of said binary mathematical operation; and
         convert said data mask into a truncated data mask according to a selected conversion scheme;
      iv. compute an identifier for a data mask chain which comprises said initial data block, each data mask and said terminal data block; and
      v. store said identifier and said a compressed data chain as compressed output data wherein said compressed data chain comprises said initial data block, each truncated data mask and said terminal data block.

24. A method of compressing random input data represented as a plurality of bits, comprising:
   a. means for dividing the random input data into an ordered sequence of input data blocks which includes an initial data block, a plurality of intermediate data blocks, and a terminal data block;
   b. means for truncating the intermediate data blocks into a stream of truncated data;
   c. means for computing a unique identifier for masking data that is derived from the random input data; and
   d. storage means for storing said unique identifier and a compressed data chain as compressed data output, wherein said compressed data chain comprises said initial data block, said truncated data and said terminal data block.

* * * * *